(12) United States Patent
Dhori

(10) Patent No.: US 8,154,936 B2
(45) Date of Patent: Apr. 10, 2012

(54) SINGLE-ENDED BIT LINE BASED STORAGE SYSTEM

(75) Inventor: Kedar Janardan Dhori, Uttar Pradesh (IN)

(73) Assignee: STMicroelectronics Pvt. Ltd., Greater Noida (IN)

( * ) Notice: Subject to any disclaimer, the term of this patent is extended or adjusted under 35 U.S.C. 154(b) by 424 days.

(21) Appl. No.: 12/345,959

(22) Filed: Dec. 30, 2008

(65) Prior Publication Data

US 2010/0165755 A1    Jul. 1, 2010

(51) Int. Cl.
*G11C 7/00*    (2006.01)
(52) U.S. Cl. ............... 365/196; 365/185.07; 365/185.2; 365/185.05
(58) Field of Classification Search .......... 365/196, 365/185.05, 185.07, 185.2
See application file for complete search history.

(56) References Cited

U.S. PATENT DOCUMENTS

| | | | | |
|---|---|---|---|---|
| 5,646,893 A | * | 7/1997 | McMinn et al. | 365/189.05 |
| 5,729,493 A | * | 3/1998 | Morton | 365/185.21 |
| 5,754,482 A | * | 5/1998 | Su et al. | 365/189.07 |
| 6,909,656 B2 | * | 6/2005 | Moore et al. | 365/222 |
| 2004/0100845 A1 | * | 5/2004 | Subramanian et al. | 365/209 |
| 2005/0146958 A1 | * | 7/2005 | Moore et al. | 365/203 |
| 2010/0039866 A1 | * | 2/2010 | Roohparvar | 365/185.25 |
| 2011/0199812 A1 | * | 8/2011 | Kitagawa et al. | 365/148 |

* cited by examiner

*Primary Examiner* — Tuan T. Nguyen
(74) *Attorney, Agent, or Firm* — Wolf, Greenfield & Sacks, P.C.

(57) ABSTRACT

A single-ended bit line based storage system. The storage system includes a first set of storage cells, a second set of storage cells, a first set of reference storage cells, a second set of reference storage cells, and a differential sensing block. The memory core is split vertically in half vertically to form the first set of storage cells and the second set of storage cells. The first set of reference storage cells provides a discharge rate lower than the discharge rate of said first set and second set of storage cells for storing data. The second set of reference storage cells provides a discharge rate lower than the discharge rate of said first set and second set of storage cells for storing data. The differential sensing block is coupled to the first set of storage cells and the second set of storage cells for generating an output data signal on receiving a control signal.

12 Claims, 4 Drawing Sheets

SINGLE-ENDED BIT LINE BASED STORAGE SYSTEM

BACKGROUND OF THE INVENTION

1. Field of the Invention

The present disclosure relates to storage system, and more specifically to a storage system utilizing single bitline based sensing techniques for reading out data.

2. Discussion of the Related Art

Storage devices include a plurality of bit lines, with each bit line having a logic state indicating the data being read from the memory. Bit lines are either single ended or differential ended. A single ended bit line is normally pre-charged to a high voltage level. In a read operation, the pre-charge on the bit line is removed and the bit line stays at a high or a low level depending upon the data stored on the bit line.

Single-ended bit line structures are adapted to various types of memories such as read only memories (ROM), a multi-port static random access memory (SRAM), and a programmable logic array (PLA). The single-ended bit line structures amplify and sense the voltage difference between a referenced bitline and a bit line coupled to the cell in which data is stored. If stored data on the bit line is '1' then the bit line does not discharge. However, if the stored data on the bit line is '0', the bit line discharges.

The difficulty arises when a non discharge bit line has to be read i.e. when the stored data on the bit line is '1'; as it has zero differential voltage if Vdd is used as the reference voltage.

FIG. 1 illustrates a conventional memory device having a single-ended sense amplifier. The single-ended sense amplifier includes a differential sense amplifier for sensing and amplifying the voltage difference between a reference voltage provided by a reference voltage generator and the sensed bit line voltage. The reference voltage generator consumes significant power hence such a memory device is inefficient. This topology is also sensitive to process variations as the reference voltage (Vref) value is dependent on the threshold voltage ($V_{th}$) of the PMOS and NMOS transistors.

BRIEF DESCRIPTION OF THE DRAWINGS

The present disclosure explains the various embodiments in accordance with the instant disclosure in the following description, taken in conjunction with the accompanying drawings, where.

DETAILED DESCRIPTION

Figure 1:
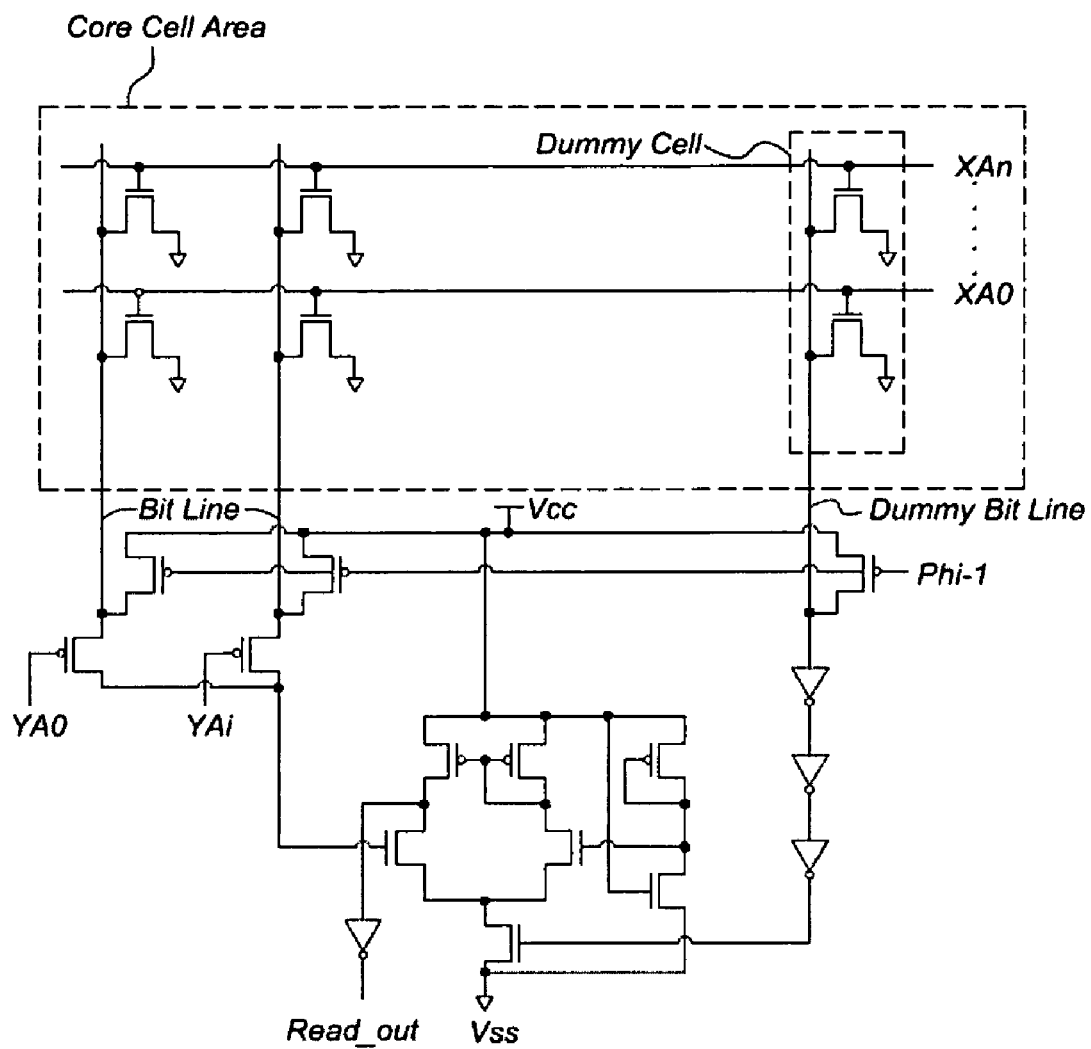
FIG. 1 illustrates a conventional memory device having a single-ended sense amplifier.

Embodiments of the present disclosure are described in detail with reference to the accompanying drawings. However, the present disclosure is not limited to these embodiments which are only provided to explain more clearly the present disclosure to those ordinarily skilled in the art of the present disclosure. In the accompanying drawings, like reference numerals are used to indicate like components.

The present disclosure teaches a storage system comprising a first and second set of storage cells for storing data, a first and second set of reference storage cells for providing a reference voltage, and a differential sensing block (DSB). The first and second set of reference storage cells are designed to provide a discharge rate lower than the discharge rate of said first and second set of storage cells. The first set of reference storage cells provides a reference voltage, when data is read from said second set of storage cells. The second set of reference storage cells provides a reference voltage, when data is read from said first set of storage cells.

Figure 2:
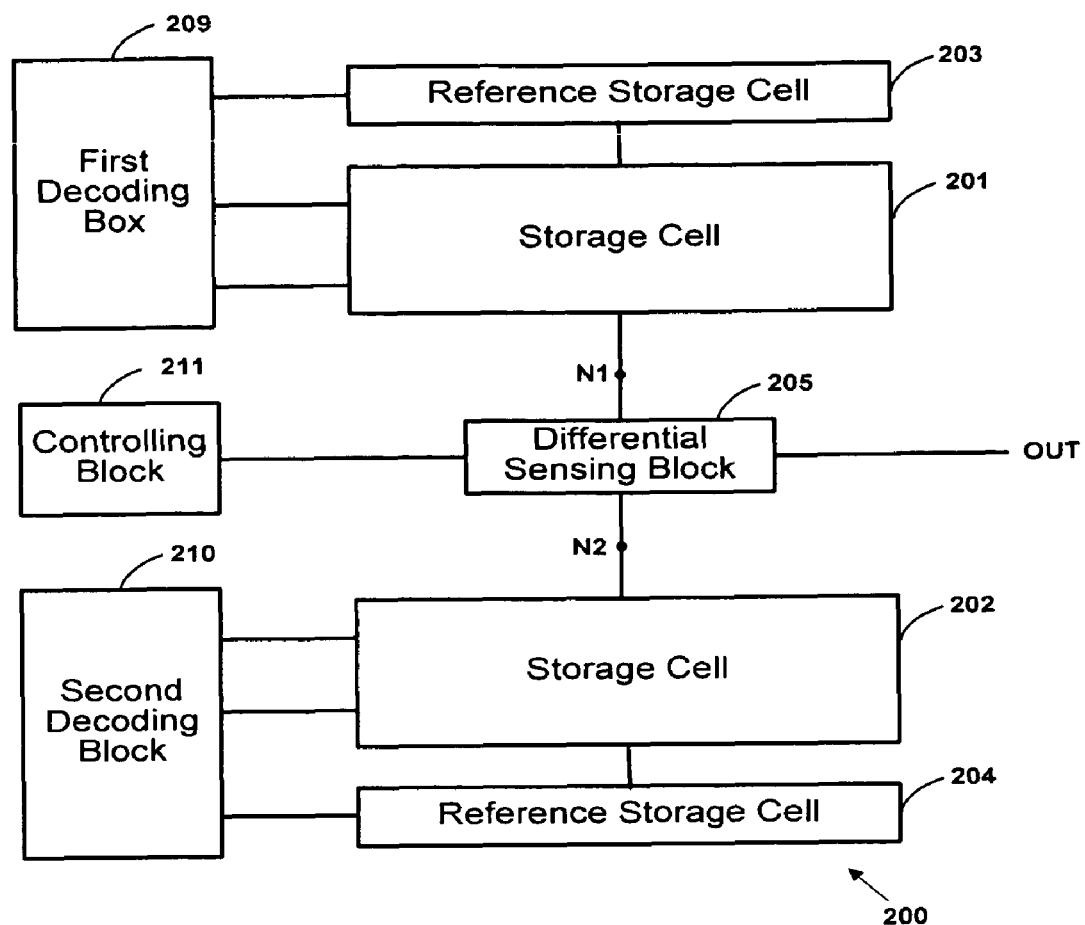
FIG. 2 illustrates a storage system according to the present disclosure.

FIG. 2 illustrates a block diagram of a storage system 200 according to the present disclosure. The storage system 200 includes a first set of storage cells 201, a second set of storage cells 202, a first set of reference storage cells 203, a second set of reference storage cells 204, and a differential sensing block 205. The storage system 200 further includes the first decoding block 209, the second decoding block 210, and the controlling block 211. The first and second sets of storage cells (201 and 202) are derived from a memory core. The memory core is split in half vertically to form the first set of storage cells 201 and the second set of storage cells 202. It is also known as divided bit line architecture or bank architecture. The differential sensing block 205 is coupled to the first set of storage cells 201 and the second set of storage cells 202 for generating an output data signal OUT on receiving a control (enable) signal. The first decoding block 209 is coupled to the first set of storage cells 201 for providing a first word line signal to the first set of storage cells 201. The second decoding block 210 is coupled to the second set of storage cells 202 for providing a second word line signal to the second set of storage cells 202. The controlling block 211 is coupled to the differential sensing block 205 for providing the control signal (enable signal) to the differential sensing block 205.

Figure 3:
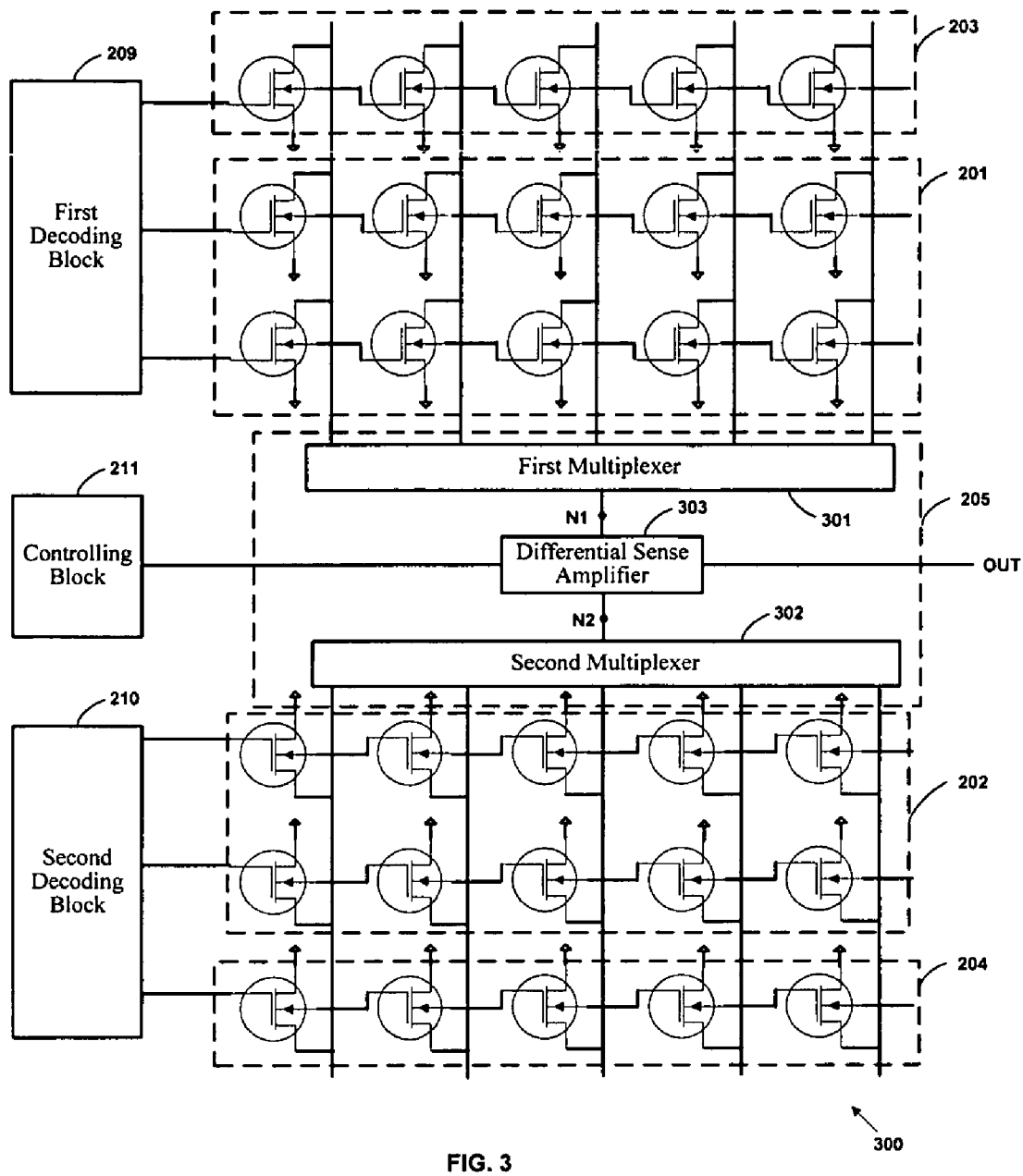
FIG. 3 illustrates a storage system according to an embodiment of the present disclosure.

FIG. 3 illustrates a storage system 300 according to an embodiment of the present disclosure. The first and second sets of storage cells (201 and 202) include one or more storage cells for storing data. The first and second sets of reference storage cells (203 and 204) include one or more MOS transistors. The ratio of width to length of the MOS transistor of the reference storage cells (203 and 204) is twice the ratio of width to length of a MOS transistor of a corresponding storage cell in said first and second set of storage cells (201 and 202) for storing a binary bit of data. Thus, the design of MOS transistors provide a lower discharge rate of the first and second set of reference storage cells compared to the discharge rate of said first and second set of storage cells. The gate terminal of each MOS transistor in a row of cells is coupled to a common wordline. The wordlines are coupled to a wordline decoder 209, 210. The drain terminal of each cell in columns is coupled to a common pre-charged bit line. The differential sensing block 205 includes a first multiplexer 301, a second multiplexer 302, and a differential sense amplifier 303. When the first set of storage cells 201 is read, the first input node N1 receives a bit line voltage and the second input node N2 receives a reference bit line voltage. When the second set of storage cells 202 is read, the first input node N1 receives a reference bit line voltage and the second input node N2 receives a bit line voltage. The differential sense amplifier 303 is coupled to the first multiplexer 301 and the second multiplexer 302 through nodes N1 and N2 for receiving either a bit line voltage or a reference bit line voltage.

Figure 4:
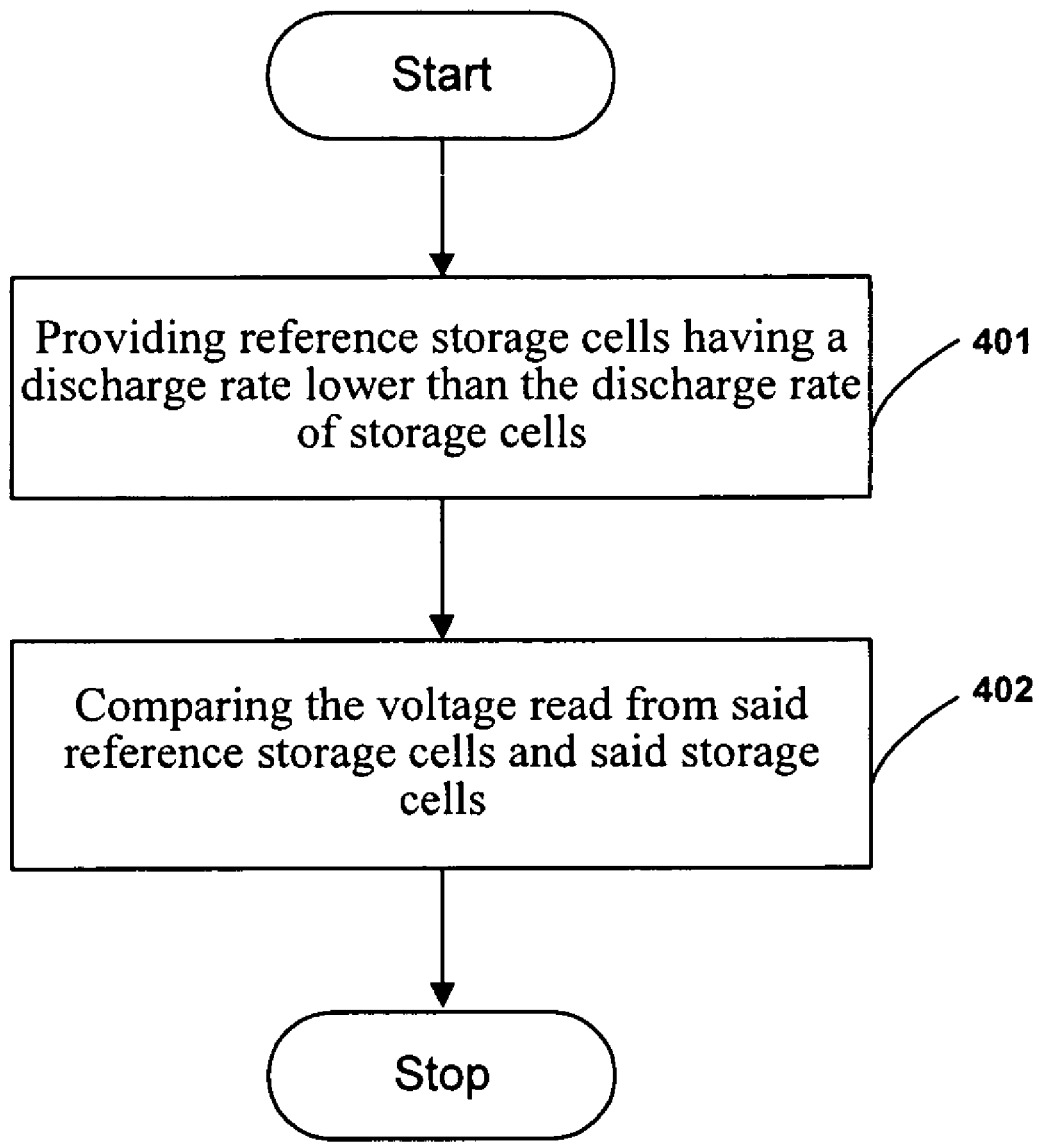
FIG. 4 illustrates a flow diagram of a method for reading data from storage cells according to an embodiment of the present disclosure.

FIG. 4 illustrates a method of reading data from storage cells according to an embodiment of the present disclosure. The method is illustrated as a collection of blocks in a logical flow graph, which represents a sequence of operations that can be implemented in hardware, software, or a combination thereof. The order in which the process is described is not intended to be construed as a limitation, and any number of the described blocks can be combined in any order to implement the process, or an alternate process.

A bit line and wordline is selected from the storage system 200. The reference bit line voltage is provided from the second set of storage cells 202, when the first set of storage cells 201 is read. The reference bit line voltage is provided from the first set of storage cells 201, when the second set of storage cells 202 is read. The discharge rate of the reference storage cells is lower than the discharge rate of the storage cells 201. The bit line voltage and the reference bit line voltage are read/sensed on receiving a sense enable signal. The voltage read from said reference storage cells are compared with said storage cells 202 to generate an output data signal OUT.

In an embodiment of the present disclosure, an actual bit line, which is to be read, is in either of the two states i.e. discharging (Read 0 state) or a non discharging (Read 1 state) depending on the cell data 0 or 1. A discharge rate of the reference bit line through the reference cell is slow with respect to the actual bit line (Read 0) and high enough that the differential voltage created for Read 1 (BL non discharging) is sufficiently high than the offset required for the differential sense amplifier 108. Hence, the reference voltage V2 is always between the Read 1 bit line voltage and Read 0 bit line voltage where Read 1 bit line voltage is Vdd, Read 0 bit line voltage is V1 and reference bit line voltage is V2. So Vdd>V2>V1 thus (Vdd−V2) is greater than Offset of sense amplifier and also (V2−V1) is greater than Offset of sense amplifier. Thus, proper read operations R0 and R1 are ensured.

An embodiment of the disclosure is related to single-ended bit line architecture and is used in various applications, such as applications for sensing of ROM, Flash and SRAM using the single ended bit line architecture. The single-ended bit line architecture improves the robustness of storage system and provides better area utilization and speed.

Although the disclosure of system and method has been described in connection with the embodiment of the present disclosure illustrated in the accompanying drawings, it is not limited thereto. It will be apparent to those skilled in the art that various substitutions, modifications and changes may be made thereto without departing from the scope and spirit of the disclosure.

We claim:

1. A system comprising a storage subsystem, said storage subsystem, comprising:
   a first set of storage cells for storing data;
   a second set of storage cells for storing data;
   a first set of reference storage cells with a discharge rate lower than the discharge rate of said first set and second set of storage cells;
   a second set of reference storage cells with a discharge rate lower than the discharge rate of said first set and second set of storage cells; and
   a differential sensing block (DSB);
   the arrangement being such that when data is required to be read from said first set of storage cells, the output of said first set of storage cells is coupled to one input of said DSB and the output of said second set of reference storage cells is coupled to the other input of said DSB, and when data is required to be read from said second set of storage cells, the output of said second set of storage cells is coupled to one input of said DSB while the output of said first set of reference storage cells is coupled to the other input of said DSB.

2. The system as claimed in claim 1, wherein said first and second set of reference storage cells comprise one or more MOS transistors having the ratio of width to length twice the ratio of width to length of a MOS transistor of a corresponding storage cell in said first and second set of storage cells for storing data.

3. A system as defined in claim 1, further comprising a first decoding block coupled to the first set of storage cells for providing a first word line signal to the first set of storage cells and a second decoding block coupled to the second set of storage cells for providing a second word line signal to the second set of storage cells.

4. A storage subsystem comprising:
   a first set of storage cells for storing data;
   a second set of storage cells for storing data;
   a first set of reference storage cells with a discharge rate lower than the discharge rate of said first set and second set of storage cells;
   a second set of reference storage cells with a discharge rate lower than the discharge rate of said first set and second set of storage cells; and
   a differential sensing block (DSB);
   the arrangement being such that when data is required to be read from said first set of storage cells, the output of said first set of storage cells is coupled to one input of said DSB and the output of said second set of reference storage cells is coupled to the other input of said DSB, and when data is required to be read from said second set of storage cells the output of said second set of storage cells is coupled to one input of said DSB while the output of said first set of reference storage cells is coupled to the other input of said DSB.

5. The storage subsystem as claimed in claim 4, wherein said first and second set of reference cells comprise one or more MOS transistors having the ratio of width to length twice the ratio of width to length of a MOS transistor of a corresponding storage cell in said first and second set of storage cells for storing data.

6. A method of reading data from storage subsystems comprising:
   providing reference storage cells having a discharge rate lower than the discharge rate of storage cells; and
   comparing the voltage read from said reference storage cells and said storage cells.

7. A system comprising a storage subsystem, said storage subsystem comprising:
   a set of storage cells for storing data;
   a set of reference storage cells with a discharge rate lower than the discharge rate of said set of storage cells; and
   a differential sensing block, wherein an output of said set of storage cells is coupled to one input of the differential sensing block and an output of the set of reference storage cells is coupled to the other input of the differential sensing block to read data from said set of storage cells.

8. A system as defined in claim 7, wherein the set of reference storage cells comprises one or more MOS transistors having a ratio of width to length twice a ratio of width to length of an MOS transistor of a corresponding storage cell in the set of storage cells for storing data.

9. A system as defined in claim 6, further comprising a control block, wherein the differential sensing block generates an output data signal in response to a control signal from the control block.

10. A storage subsystem comprising:
    a set of storage cells for storing data;
    a set of reference storage cells with a discharge rate lower than the discharge rate of said set of storage cells; and a differential sensing block, wherein an output of the set of storage cells is coupled to one input of the differential sensing block and an output of the set of reference storage cells is coupled to the other input of the differential sensing block to read data from said set of storage cells.

11. A storage subsystem as defined in claim 10, wherein the set of reference storage cells comprises one or more MOS transistors having a ratio of width to length twice a ratio of width to length of an MOS transistor of a corresponding storage cell in the set of storage cells for storing data.

12. A storage subsystem as defined in claim 10, further comprising a control block, wherein the differential sensing block generates an output data signal in response to a control signal from the control block.

* * * * *